(12) United States Patent
Thach et al.

(10) Patent No.: US 8,941,969 B2
(45) Date of Patent: Jan. 27, 2015

(54) SINGLE-BODY ELECTROSTATIC CHUCK

(71) Applicant: Applied Materials, Inc., Santa Clara, CA (US)

(72) Inventors: Senh Thach, Union City, CA (US); Dmitry Lubomirsky, Cupertino, CA (US); Jennifer Y. Sun, Mountain View, CA (US); Konstantin Makhratchev, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 29 days.

(21) Appl. No.: 13/725,449

(22) Filed: Dec. 21, 2012

(65) Prior Publication Data
US 2014/0177123 A1   Jun. 26, 2014

(51) Int. Cl.
*H01T 23/00* (2006.01)
*H01L 21/67* (2006.01)
*H01L 21/683* (2006.01)

(52) U.S. Cl.
CPC .... *H01L 21/67103* (2013.01); *H01L 21/67109* (2013.01); *H01L 21/6831* (2013.01)
USPC .......................................... 361/234; 361/230

(58) Field of Classification Search
USPC ................................................. 361/230, 234
See application file for complete search history.

(56) References Cited

U.S. PATENT DOCUMENTS

| | | | |
|---|---|---|---|
| 4,439,248 A | 3/1984 | Herchenroeder et al. | |
| 5,381,944 A | 1/1995 | Makowiecki et al. | |
| 5,548,470 A | 8/1996 | Husain et al. | |
| 5,631,803 A | 5/1997 | Cameron et al. | |
| 5,800,871 A | 9/1998 | Collins et al. | |
| 5,916,689 A | 6/1999 | Collins et al. | |
| 6,063,203 A | 5/2000 | Satoh | |
| 6,194,083 B1 | 2/2001 | Yasuda et al. | |
| 6,245,202 B1 * | 6/2001 | Edamura et al. | 204/298.06 |
| 6,361,645 B1 | 3/2002 | Schoepp et al. | |
| 6,506,254 B1 | 1/2003 | Bosch et al. | |
| 6,534,194 B2 | 3/2003 | Weihs et al. | |
| 6,581,275 B2 | 6/2003 | Narendrnath et al. | |
| 6,616,031 B2 | 9/2003 | Wong et al. | |
| 6,805,952 B2 | 10/2004 | Chang et al. | |
| 6,933,254 B2 | 8/2005 | Morita et al. | |

(Continued)

FOREIGN PATENT DOCUMENTS

| | | |
|---|---|---|
| DE | 03/01654 | 6/2003 |
| WO | WO 01/24581 | 4/2001 |

(Continued)

OTHER PUBLICATIONS

Taffner et al., "Preparation and Microstructural Analysis of High-Performance Ceramics," ASM Handbook vol. 9: Metallography and Microstructures, 2004, 11 pages, ASM International, Materials Park, Ohio, USA.

(Continued)

*Primary Examiner* — Danny Nguyen
(74) *Attorney, Agent, or Firm* — Lowenstein Sandler LLP (57) ABSTRACT

An electrostatic chuck includes a thermally conductive base having a plurality of heating elements disposed therein. A metal layer covers at least a portion of the thermally conductive base, wherein the metal layer shields the plurality of heating elements from radio frequency (RF) coupling and functions as an electrode for the electrostatic chuck. A plasma resistant dielectric layer covers the metal layer.

20 Claims, 5 Drawing Sheets

(56) References Cited

U.S. PATENT DOCUMENTS

| | | |
|---|---|---|
| 6,942,929 B2 | 9/2005 | Han et al. |
| 7,441,688 B2 | 10/2008 | Van Heerden et al. |
| 7,615,133 B2 | 11/2009 | Tateno et al. |
| 7,649,729 B2 | 1/2010 | Buchberger, Jr. et al. |
| 7,690,308 B2 | 4/2010 | Nielson et al. |
| 7,696,117 B2 | 4/2010 | Sun et al. |
| 7,718,007 B2 | 5/2010 | Oohashi et al. |
| 7,810,704 B2 | 10/2010 | Duckham et al. |
| 7,964,517 B2 | 6/2011 | Jaiswal |
| 8,034,734 B2 | 10/2011 | Sun et al. |
| 8,206,829 B2 | 6/2012 | Sun et al. |
| 8,404,572 B2 | 3/2013 | Chang et al. |
| 2003/0007308 A1 | 1/2003 | Harada et al. |
| 2003/0047802 A1 | 3/2003 | Hiramatsu et al. |
| 2005/0266682 A1 | 12/2005 | Chen et al. |
| 2006/0164785 A1 | 7/2006 | Pellegrin |
| 2007/0047170 A1 | 3/2007 | Sun et al. |
| 2007/0212567 A1 | 9/2007 | Esaki et al. |
| 2008/0016684 A1* | 1/2008 | Olechnowicz et al. ......... 29/748 |
| 2008/0029032 A1 | 2/2008 | Sun et al. |
| 2008/0174930 A1 | 7/2008 | Hattori et al. |
| 2008/0264564 A1 | 10/2008 | Sun et al. |
| 2008/0264565 A1 | 10/2008 | Sun et al. |
| 2008/0268645 A1 | 10/2008 | Kao et al. |
| 2009/0034147 A1 | 2/2009 | Narendrnath et al. |
| 2009/0034148 A1 | 2/2009 | Lubomirsky et al. |
| 2009/0034149 A1 | 2/2009 | Lubomirsky et al. |
| 2009/0036292 A1 | 2/2009 | Sun et al. |
| 2009/0214825 A1 | 8/2009 | Sun et al. |
| 2009/0284894 A1 | 11/2009 | Cooke |
| 2010/0053841 A1* | 3/2010 | Rusinko et al. ............... 361/234 |
| 2010/0177454 A1 | 7/2010 | Elliot et al. |
| 2010/0314356 A1 | 12/2010 | Nagayama et al. |
| 2011/0049729 A1 | 3/2011 | Naundorf et al. |
| 2011/0149462 A1 | 6/2011 | Kugimoto et al. |
| 2011/0174441 A1 | 7/2011 | Yamashita et al. |
| 2012/0034469 A1 | 2/2012 | Sun et al. |
| 2012/0076574 A1 | 3/2012 | Parke |
| 2012/0104703 A1 | 5/2012 | Sun et al. |
| 2012/0299253 A1 | 11/2012 | Kosakai et al. |
| 2012/0307412 A1 | 12/2012 | Boyd, Jr. et al. |
| 2013/0019797 A1 | 1/2013 | Tanaka et al. |
| 2013/0026720 A1 | 1/2013 | Hori et al. |
| 2013/0224675 A1 | 8/2013 | Park |

FOREIGN PATENT DOCUMENTS

| | | |
|---|---|---|
| WO | WO 03/100843 | 12/2003 |
| WO | WO 2005-027203 | 3/2005 |

OTHER PUBLICATIONS

Bhatia et al., "Mechanisms of ceramic coating deposition in solution-precursor plasma spray," J.Mater. Res., vol. 17, No. 9, Sep. 2002, 10 pages, Materials Research Society, Warrendale, PA, USA.

Haas et al., "Gas jet assisted vapor deposition of yttria stabilized zirconia," Department of Materials Science and Engineering, School of Engineering and Applied Science, published Feb. 27, 2009 University of Virginia, Charlottesville, Virginia 22903.

Di Girolamo et al., "Microstructure and thermal properties of plasma-sprayed ceramic thermal barrier coatings," Energia, Ambiente e Innovazione, Published Jan.-Feb. 2013.

Bergant et al., "Porosity evaluation of flame-sprayed and heat-treated coatings using image analysis," Image Anal Stereol 2011;30:53-62, Published Jan. 27, 2011.

International Search Report & Written Opinion of the International Searching Authority dated Mar. 6, 2014, in International Application No. PCT/US2013/074494.

* cited by examiner

SINGLE-BODY ELECTROSTATIC CHUCK

TECHNICAL FIELD

Embodiments of the present invention relate, in general, to an electrostatic chuck.

BACKGROUND

In the semiconductor industry, devices are fabricated by a number of manufacturing processes producing structures of an ever-decreasing size. Some manufacturing processes such as plasma etch and plasma clean processes expose a substrate support (e.g., an edge of the substrate support during wafer processing and the full substrate support during chamber cleaning) to a high-speed stream of plasma to etch or clean the substrate. The plasma may be highly corrosive, and may corrode processing chambers and other surfaces that are exposed to the plasma.

Additionally, traditional electrostatic chucks include a ceramic puck silicone bonded to a metal cooling plate. The Ceramic puck in such traditional electrostatic chucks is manufactured by a multi-step manufacturing process that can be costly to form an embedded electrode and heating elements.

SUMMARY

In one embodiment, an electrostatic chuck includes a thermally conductive base having a plurality of heating elements in the thermally conductive base. A metal layer covers at least a portion of the thermally conductive base, wherein the metal layer shields the plurality of heating elements from radio frequency (RF) coupling and functions as an electrode for the electrostatic chuck. A plasma resistant dielectric layer covers the metal layer.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the present invention provide a single-body electrostatic chuck. The single-body electrostatic chuck includes a thermally conductive base having a collection of internal components and a series of coatings. The coatings may include a metal layer coating that may function as a clamping electrode and/or a radio frequency (RF) electrode and a dielectric layer coating that is a plasma resistant ceramic. One or more recesses may be formed on an upper surface of the thermally conductive base. These recesses may include auxiliary heating elements, which may provide localized heating to maintain temperature uniformity across supported substrates (e.g., chucked wafers). The metal layer may cover the auxiliary heating elements, and may provide an RF shield that protects the auxiliary heating elements from RF coupling.

Unlike traditional electrostatic chucks, the single-body electrostatic chuck may lack an electrostatic puck (which traditionally contains an electrode and heating elements). As a result, embodiments of the single-body electrostatic chuck may be cheaper to manufacture than traditional electrostatic chucks. Additionally, embodiments of the single-body electrostatic chuck may provide improved temperature uniformity as compared to traditional electrostatic chucks, and may have improved plasma resistance as compared to traditional electrostatic chucks. Moreover, embodiments provide an electrostatic chuck that can adjust temperature rapidly. The electrostatic chuck and a substrate being supported may be heated or cooled quickly, with some embodiments enabling temperature changes of 2° C./s or faster. This enables the electrostatic chuck to be used in multi-step processes in which, for example, a wafer may be processed at 20-30° C. and then rapidly ramped up to 80-90° C. for further processing. The embodiments described herein may be used for both Columbic electrostatic chucking applications and Johnson Raybek chucking applications.

Figure 1:
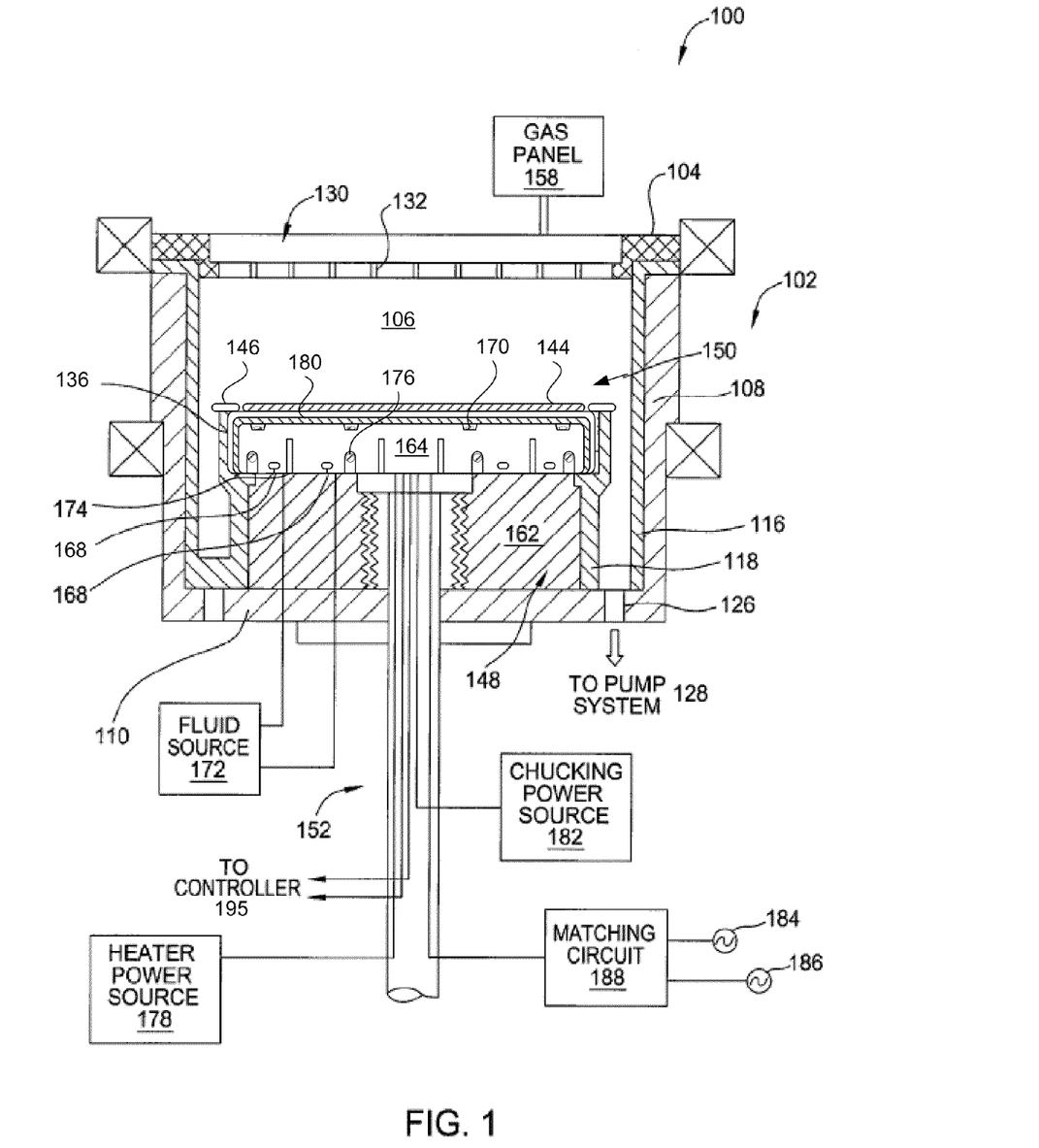
FIG. 1 depicts a sectional view of one embodiment of a processing chamber.

FIG. 1 is a sectional view of one embodiment of a semiconductor processing chamber 100 having a substrate support assembly 148 disposed therein. The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow excess to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

The substrate support assembly 148 is disposed in the interior volume 106 of the processing chamber 100 below the gas distribution assembly 130. The substrate support assembly 148 holds the substrate 144 (e.g., a wafer) during processing. An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 148 includes a mounting plate 162 supporting a pedestal 152, and an electrostatic chuck 150. A quartz ring 146, or other protective ring, surrounds and covers portions of the electrostatic chuck 150. The electrostatic chuck 150 includes a thermally conductive base 164 having multiple internal features and multiple coatings. In one embodiment, the thermally conductive base 164 is a metal body (e.g., aluminum) that includes one or more embedded heating elements 176, embedded thermal isolators 174 and/or conduits 168 to control a lateral temperature profile of the support assembly 148. The conduits 168 may be fluidly coupled to a fluid source 172 that circulates a temperature regulating fluid through the conduits 168. The embedded thermal isolators 174 may be disposed between the conduits 168 in one embodiment. The heating elements 176 are regulated by a heater power source 178. The conduits 168 and heating elements 176 may be utilized to control the temperature of the thermally conductive base 164, thereby heating and/or cooling the electrostatic chuck 150 and a substrate (e.g., a wafer) 144 being processed. The temperature of the thermally conductive base 164 may be monitored using a plurality of temperature sensors, which may be monitored using a controller 195.

In addition to the heating elements 176, the thermally conductive base 164 may include one or more auxiliary heating elements 170. The auxiliary heating elements 170 may be localized or booster heaters that may apply additional heat to targeted regions of the thermally conductive base 164 and/or substrate 144. By using the heating elements 176 and auxiliary heating elements 170 together, the electrostatic chuck 150 may maintain a high temperature uniformity across the substrate 144 (e.g., to within 0.5 degrees C.).

An upper surface of the metal body 164 is covered by a metal layer 180. The metal layer 180 may also cover one or more sides of the metal body 164. The metal layer 180 may be coupled to a chucking power source 182, and may function as a clamping electrode to clamp the substrate 144 to the electrostatic chuck 150. The chucking power source may apply a direct current (DC) voltage, which may be filtered through a low pass filter before being applied to the metal layer 180.

The metal layer 180 may further be coupled to one or more RF power sources 184, 186 through a matching circuit 188 for maintaining a plasma formed from process and/or other gases within the processing chamber 100. In one embodiment, the coupling of the metal layer 180 to the matching circuit 188 is through a coax delivery line (e.g., a coaxial tube). The coax delivery line may include an insulating tube, encased in a metal tube, encased in another insulating tube. Alternatively, the coax delivery line may include a metal tube coated on an inside and an outside with an insulating layer (e.g., a dielectric material). RF power delivered to the metal layer 180 via the coax delivery line may be applied across an exterior of the metal tube. Remaining control wires (e.g., to controller 195, heater power source, 178, heating elements 168, auxiliary heating elements 170, etc.) run through an inside of the coax delivery line. Thus, the control wires are shielded from RF coupling by the metal tube.

One or more DC-blocking capacitors may be interposed between the matching circuit 188 and the metal layer 180. The sources 184, 186 are generally capable of producing RF signal having a frequency from about 50 kHz to about 3 GHz and a power of up to about 10,000 Watts. In one embodiment, an RF signal is applied to the metal layer 180, an alternating current (AC) is applied to the heater and a direct current (DC) is also applied to the metal layer 180. Alternatively, a separate RF electrode may be embedded in the thermally conductive base 164, and the matching circuit 188 may be coupled to the separate RF electrode.

The metal layer 180 is coated by a dielectric layer 136, which may be plasma resistant. In one embodiment, the dielectric layer 136 is disposed on the upper surface of the metal body 164 over the metal layer 180. In another embodiment, the dielectric layer 136 extends to the sides of the metal body 164, also covering the metal layer 180 on the sides.

The dielectric layer 136 may be a deposited, sprayed or grown ceramic such as $Y_2O_3$ (yttria or yttrium oxide), $Y_4Al_2O_9$ (YAM), $Al_2O_3$ (alumina) $Y_3Al_5O_{12}$ (YAG), YAlO3 (YAP), Quartz, SiC (silicon carbide) $Si_3N_4$ (silicon nitride) Sialon, MN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride) $Y_2O_3$ stabilized $ZrO_2$ (YSZ), and so on. The dielectric layer 136 may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The dielectric layer 136 may also be a ceramic composite that includes a yttrium oxide (also known as yttria and $Y_2O_3$) containing solid solution. For example, the dielectric layer 136 may be a high performance material (HPM) that is composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the dielectric layer may be sapphire or MgAlON.

In one embodiment, the dielectric layer is a an HPM ceramic composite produced from a mixture of a $Y_2O_3$ powder, a $ZrO_2$ powder and $Al_2O_3$ powder. In one embodiment, the HPM ceramic composite contains 77% $Y_2O_3$, 15% $ZrO_2$ and 8% $Al_2O_3$. In another embodiment, the HPM ceramic composite contains 63% $Y_2O_3$, 23% $ZrO_2$ and 14% $Al_2O_3$. In still another embodiment, the HPM ceramic composite contains 55% $Y_2O_3$, 20% $ZrO_2$ and 25% $Al_2O_3$. Relative percentages may be in molar ratios. For example, the HPM ceramic composite may contain 77 mol % $Y_2O_3$, 15 mol % $ZrO_2$ and 8 mol % $Al_2O_3$. Other distributions of these ceramic powders may also be used for the HPM material.

The mounting plate 162, which is an insulator (e.g., a dielectric material), is attached to the bottom 110 of the chamber body 102 and includes passages for routing utilities (e.g., fluids, power lines, sensor leads, etc.) to the thermally conductive base 164. The dielectric layer 136 may further include multiple gas passages such as grooves, mesas and other surface features, that may be formed in an upper surface of the dielectric layer. The gas passages may be fluidly coupled to a source of a heat transfer (or backside) gas, such as He via holes (not shown) drilled in the thermally conductive base 164, metal layer 180 and dielectric layer 136. These holes may be filled with ceramic plugs. The ceramic plugs may be porous, and may permit the flow of helium. However, the ceramic plugs may prevent arcing of flowed plasma. In operation, the backside gas may be provided at controlled pressure into the gas passages to enhance the heat transfer between the electrostatic chuck 150 and the substrate 144.

Figure 2:
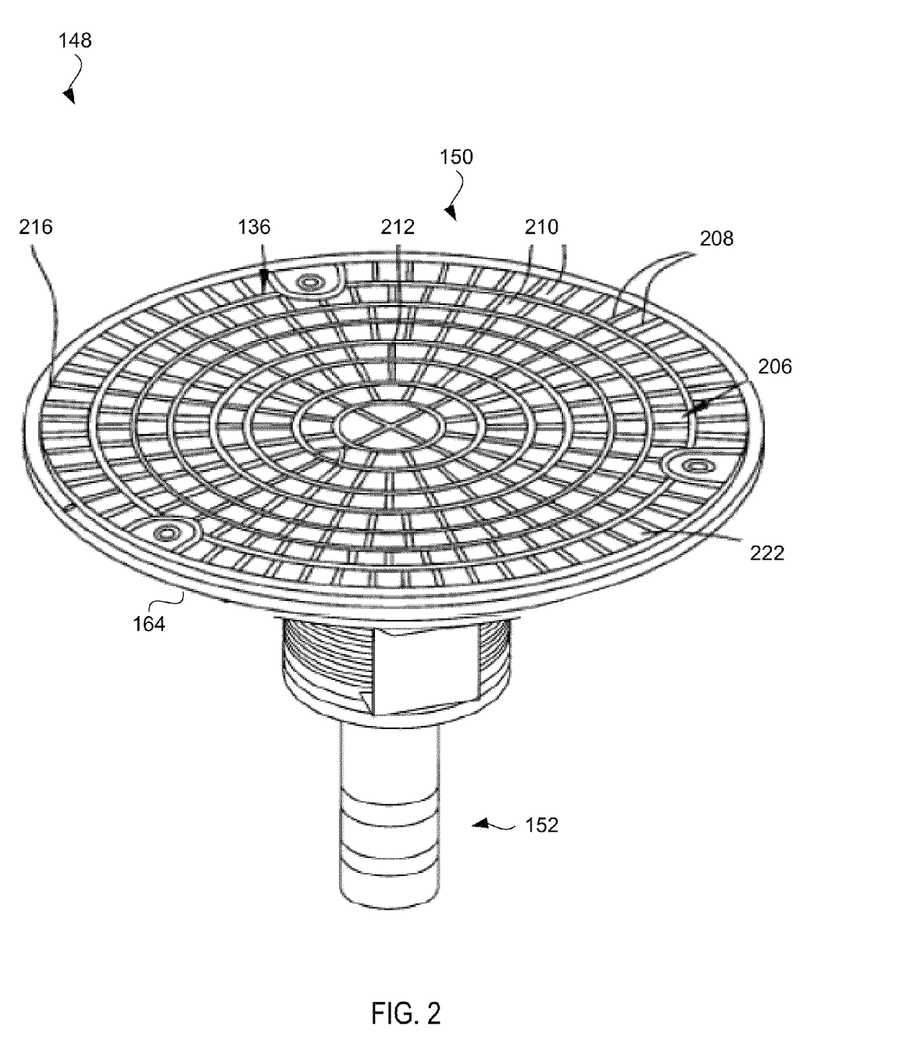
FIG. 2 depicts an exploded view of one embodiment of a substrate support assembly.

FIG. 2 depicts an exploded view of one embodiment of the substrate support assembly 148. The substrate support assembly 148 depicts an exploded view of the electrostatic chuck 150 and the pedestal 152. The electrostatic chuck 150 includes the thermally conductive base 164 covered by the metal layer (not shown) and the dielectric layer 136. The thermally conductive base 164 has a disc-like shape having an annular periphery 222 that may substantially match the shape and size of the substrate 144 positioned thereon. In one embodiment, the thermally conductive base 164 may be fabricated by a metal such as aluminum, stainless steel or other suitable materials. In alternative embodiments, the thermally conductive base 164 may be a thermally conductive ceramic. For example, the thermally conductive base 164 may be fabricated by a composite of ceramic, such as an aluminum-silicon alloy infiltrated SiC or Molybdenum. The thermally conductive base 164 should provide good strength and durability as well as heat transfer properties. An upper surface 206 of the dielectric layer 136 may have an outer ring 216, multiple mesas 210 and channels 208, 212 between the mesas.

Figure 3:
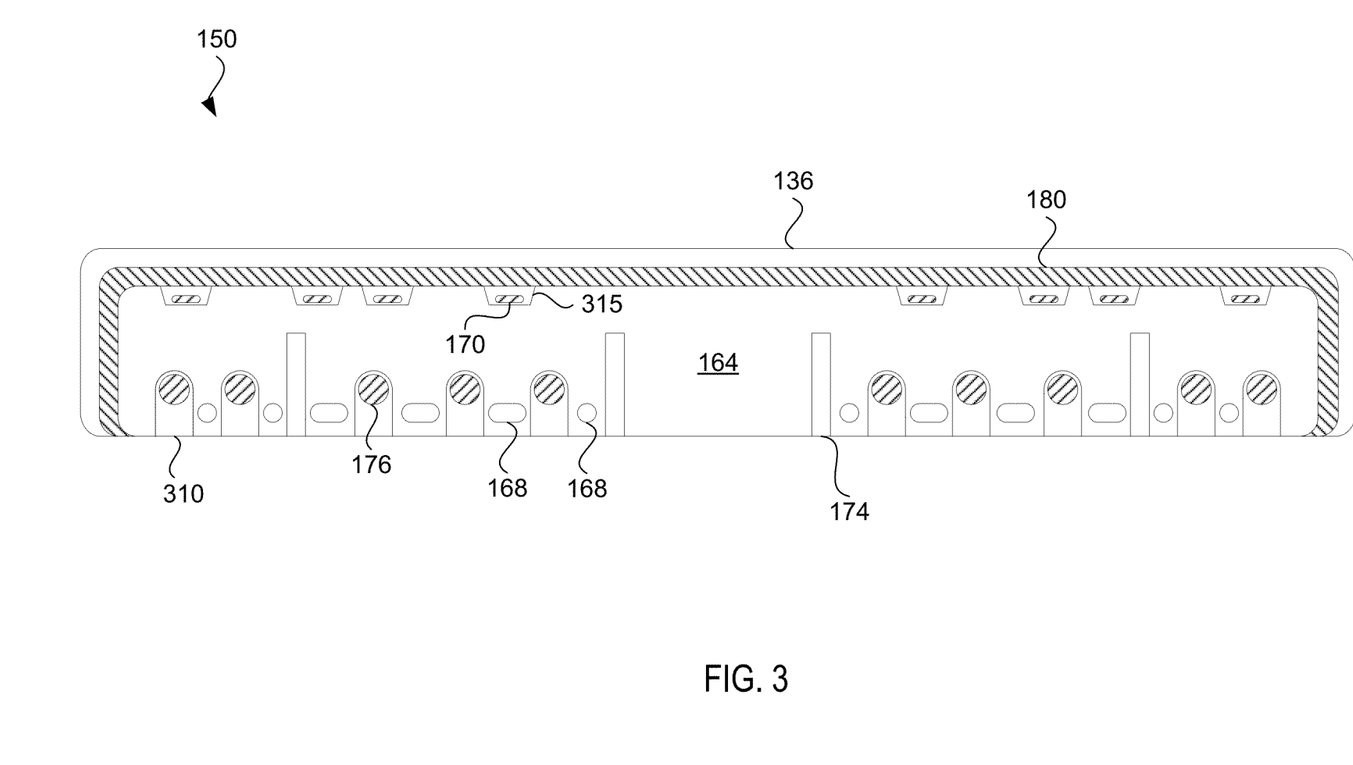
FIG. 3 depicts a side view of one embodiment of an electrostatic chuck.

FIG. 3 illustrates a cross sectional side view of the electrostatic chuck 150. Referring to FIG. 3, the thermally conductive base 164 of the electrostatic chuck 150 includes multiple heating elements 176, one or more thermal barriers 174, and conduits 168 to maintain a relatively uniform temperature across the thermally conductive base 164 and a substrate 144. A voltage may be applied to the heating elements 176 to heat the thermally conductive base 164, and heated or cooled liquid may be flowed through the conduits for temperature control. The thermally conductive base 164 may be divided into multiple thermally isolated zones by use of thermal barriers 174. In one embodiment, the thermal barriers 174 are air gaps. Alternatively, the thermal barriers 174 may comprise a material that is a poor thermal conductor, such as silicone or glass.

In one embodiment, the heating elements 176 are electrically insulated from the thermally conductive base 164 by a dielectric material 310. In one embodiment, the heating elements 176 are formed by forming recesses in a lower surface of the metal body 164. The recesses may be partially filled with the dielectric material 310, after which the heating elements 176 may be placed or formed in the recesses. The heating elements 176 may be deposited metals such as tungsten, aluminum or molybdenum. Alternatively, the heating elements 176 may be metal wires or traces that can be placed in the recesses. The recesses may then be filled with the dielectric material 310.

The thermally conductive base 164 may include one or more auxiliary heating elements 170 in addition to heating elements 176, all of which may be resistive heating elements. The auxiliary heating elements may be lower power than heating elements 176, and may be used to adjust the temperature of a targeted area of a supported substrate 144. As shown, the auxiliary heating elements 170 are located in recesses 315 in the upper surface of the thermally conductive base 164 relatively close to the top surface. Thus, the heating elements 176 and auxiliary heating elements 170 may lie on different planes within the thermally conducive base 164. The recesses 315 may be formed by etching or machining processes. After the recesses 315 are formed, a dielectric material may be deposited, followed by deposition of the auxiliary heating elements 170. The dielectric material may be, for example, aluminum oxide, yttrium oxide, magnesium oxide, or other dielectric materials. The auxiliary heating elements may be a deposited metal. The metal used for the auxiliary heating elements is preferably a non RF-heating metal with a low coefficient of expansion. Examples of metals that may be used for the auxiliary heating elements 170 includes molybdenum, aluminum and tungsten. The auxiliary heating elements 170 may have shapes of concentric or non-concentric circles, localized oval shapes, or other shapes. Quantity and placement of the localized heating elements may be selected strategically to facilitate temperature fine tuning for temperature uniformity.

A metal layer 180 is formed over the upper surface of the metal body 164, as well as over the auxiliary heating elements 170. In one embodiment, the metal layer covers the upper surface and side walls of the thermally conductive base 164. Additionally, the metal layer may cover a portion of the lower surface of the thermally conductive base 164. In embodiments where the thermally conductive base 164 is also electrically conductive (e.g. is metal), the metal layer 180 and base 164 form an RF envelope or RF box around the auxiliary heating elements 170. This may shield the auxiliary heating elements 170 from RF coupling. Such RF coupling, if not prevented, could cause the auxiliary heating elements to heat up uncontrollably, causing hot spots and/or damage to the electrostatic chuck 150 and/or a substrate 144.

The metal layer 180 may be electrically coupled to a conductive surface on a bottom side of the thermally conductive base 164. If the thermally conductive base 164 is a metal, then the metal layer 180 may be electrically coupled to the metal. The metal layer 180 may receive an RF signal and/or a DC voltage for clamping via the electrical connection. Thus, the metal layer 180 may act as one or both of a clamping electrode or an RF electrode. In one embodiment, the metal layer 180 has a thickness of approximately 20-50 mil. The metal layer may be thicker or thinner in alternative embodiments however.

A dielectric layer 136 is formed over the metal layer 180. The thickness of dielectric layer 136 may be selected to provide desired dielectric properties such as a specific breakdown voltage. In one embodiment, when the electrostatic chuck is to be used in a Columbic mode, the dielectric layer has a thickness of between about 150 microns to 1 mm (and about 200-300 microns in one example embodiment). If the electrostatic chuck is to be used in a Johnson Raybek mode, the dielectric layer may have a thickness of around 1 mm to about 1.5 mm.

As mentioned above, the dielectric layer 136 may be a sprayed, deposited, sputtered, etc. metal. In one embodiment, the dielectric layer is an HPM ceramic composite, which has a high hardness that resists wear (due to relative motion because of thermal property mismatch between substrate & the puck) during plasma processing. In one embodiment, the HPM ceramic composite provides a Vickers hardness (5 Kgf) between about 5 GPa and about 11 GPa. In one embodiment, the HPM ceramic composite provides a Vickers hardness of about 9-10 GPa. Additionally, the HPM ceramic composite may have a density of around 4.90 g/cm3, a flexural strength of about 215 MPa, a fracture toughness of about 1.6 MPa·m$^{1/2}$, a Youngs Modulus of about 190 GPa, a thermal expansion of about $8.5 \times 10^{-6}$/K (20~900° C.), a thermal conductivity of about 3.5 W/mK, a dielectric constant of about 15.5 (measured at 20° C. 13.56 MHz), a dielectric loss tangent of about $11 \times 10\text{-}4$ (20° C. 13.56 MHz), and a volume resistivity of greater than $10^{15}$ Ω·cm at room temperature in one embodiment.

In another embodiment, the dielectric layer is YAG. In another embodiment, the dielectric layer is sapphire. In still another embodiment, the dielectric layer is yttrium aluminum oxide ($Y_xAl_yO_z$).

Mesas (not shown) may be formed on a surface of the dielectric layer 136, and the dielectric layer 146, metal layer 180 and thermally conductive base 164 may include holes (not shown) for the flow of helium. Other feature such as a seal band and helium grooves may also be formed on the surface of the dielectric layer 146. Holes, mesas and/or other features may be formed after the dielectric layer 136 is formed on the thermally conductive base 164. In one embodiment, the mesas are formed by bead blasting, salt blasting or otherwise roughening a surface of the dielectric layer 136. In one embodiment, the holes are laser drilled into the layers and thermally conductive base 164.

Figure 4:
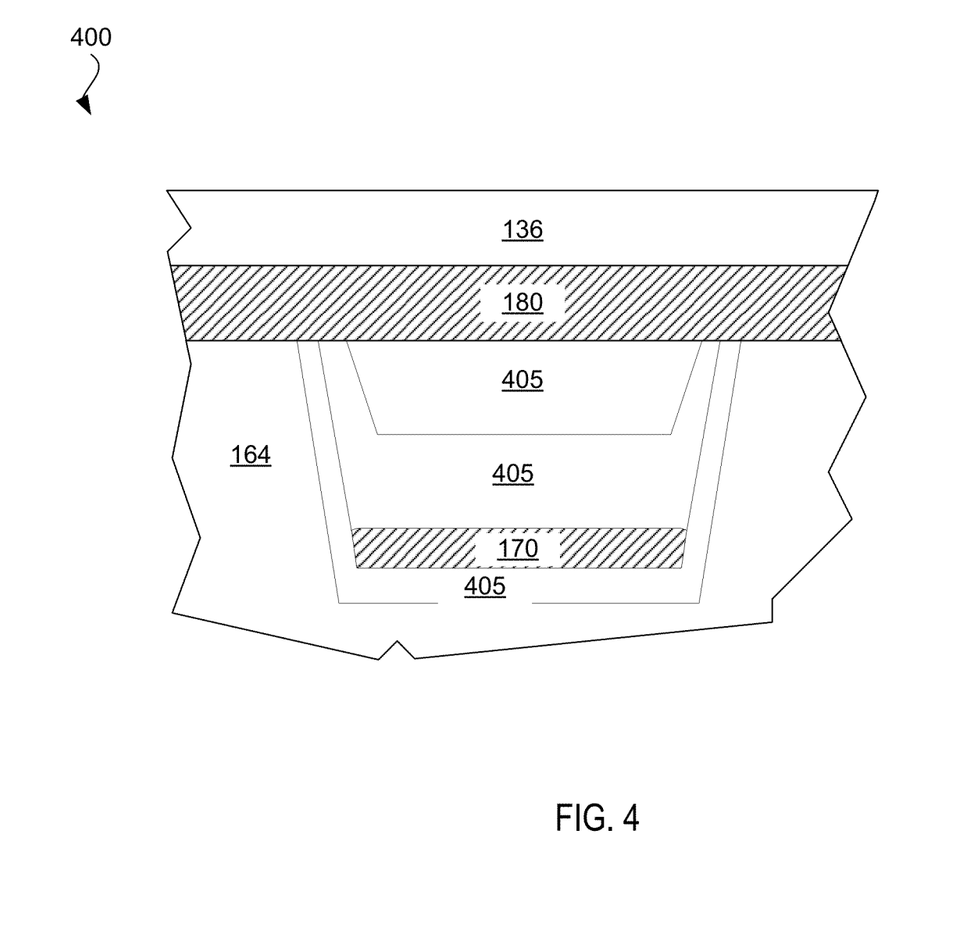
FIG. 4 depicts an exploded side view of one embodiment of a auxiliary heating element in an electrostatic chuck.

FIG. 4 depicts an exploded side view 400 of one embodiment of a auxiliary heating element 170 in an electrostatic chuck 150. The auxiliary heating element 170 is formed in a recess in the thermally conductive base 184 over a first layer of a dielectric material 405. One or more additional layers of the dielectric material 405 are then formed over the auxiliary heating element 170. The dielectric material 405 may be a deposited ceramic such as aluminum oxide ($Al_2O_3$), aluminum nitride (AlN), titanium oxide (TiO), titanium nitride (TiN), silicon carbide (SiC), yttria ($Y_2O_3$), magnesium oxide (MgO) and the like. Alternatively, the dielectric material may be other dielectric materials, such as other oxides. The metal layer 180, deposited over the auxiliary heating element 170, may shield the auxiliary heating element 170 from RF coupling. A plasma resistant dielectric layer 136 is disposed over the metal layer 180. The plasma resistant dielectric layer 136 may provide a breakdown voltage sufficient for performing electrostatic chucking, and may protect the electrostatic chuck 150 from attack by plasmas.

Figure 5:
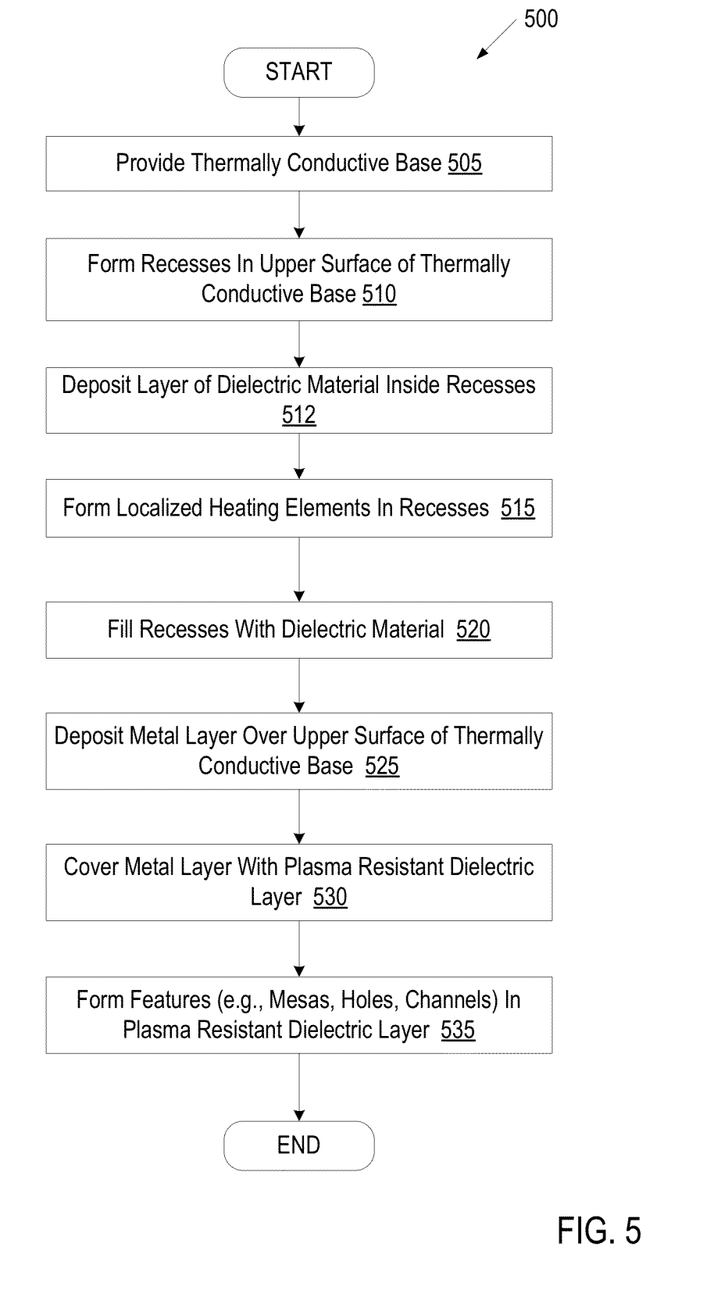
FIG. 5 illustrates one embodiment of a process for manufacturing an electrostatic chuck

FIG. 5 illustrates one embodiment of a process 500 for manufacturing an electrostatic chuck. At block 505 of process 500, a thermally conductive base is provided. The provided thermally conductive base may be a metal disk having internal components such as heating elements, thermal breaks and/or internal channels for cooling and/or heating. These internal elements may be formed in the metal base using, for example, machining, etching and deposition processes. For example, the operations described below with reference to the auxiliary heating elements may be performed on a lower surface of the thermally conductive base to form the heating elements.

At block 510, recesses are formed in an upper surface of the thermally conductive base. The recesses may be formed by etching or machining. At block 512, a layer of dielectric material is deposited inside the recesses. The layer of dielectric material may be deposited over the entire upper surface of the thermally conductive base in one embodiment. At block 515, auxiliary heating elements are formed in the recesses over the dielectric material. This may be performed by depositing a metal layer over the layer of dielectric material. The metal layer deposition may be applied by plasma spraying, physical vapor deposition (PVD), sputtering, or other deposition processes used with metals. Subsequently, the metal layer may be removed from the thermally conductive base except in the recesses. This may be performed, for example, by using lithography to define areas to etch and then etching the metal layer away other than inside the recesses.

At block 520, the recesses are filled with the dielectric material (or with a different dielectric material). This may include depositing the dielectric material over the upper surface of the thermally conductive base as well as in the recesses. After deposition of the dielectric material, the covered surface of the thermally conductive base may be ground or polished to remove the dielectric material. This may result in an approximately flat upper surface of the thermally conductive base, with the recesses being completely filled by the dielectric material.

At block 525, a metal layer is deposited over the upper surface of the thermally conductive base. The metal layer deposition may be applied by plasma spraying, PVD, sputtering, and so on the metal.

At block 530, a dielectric layer is deposited over the upper surface of the thermally conductive base to cover the metal layer. The dielectric layer may be a plasma resistant ceramic such as those previously described. The dielectric layer deposition may be applied by plasma spraying, sol-gel, aerosol deposition, PVD, or chemical vapor deposition (CVD) processes. Additionally, a combination of two or more of these processes may be performed to form the dielectric layer. The deposited dielectric layer may cover an upper surface of the thermally conductive base as well as side walls of the thermally conductive base. In one embodiment, the dielectric layer is polished/ground to a specified thickness (e.g., using chemical mechanical planarization (CMP) or other polishing techniques) after the deposition. A final thickness for the dielectric layer may be, for example, 10-20 mil.

At block 530, features are formed in the dielectric layer. This may include forming mesas formed on an upper surface of the dielectric layer (e.g., by bead blasting or salt blasting). This may also include drilling holes are in the dielectric layer, the metal layer and/or the thermally conductive base (e.g., by laser drilling) Plugs may then be formed in the holes.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/ or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An electrostatic chuck comprising:
   a thermally conductive base;
   a plurality of heating elements in the thermally conductive base, wherein the plurality of heating elements comprises a plurality of primary heating elements embedded in the thermally conductive base and a plurality of auxiliary heating elements disposed in recesses formed in an upper surface of the thermally conductive base;
   a metal layer covering at least a portion of the thermally conductive base; and
   a plasma resistant dielectric layer covering the metal layer.

2. The electrostatic chuck of claim 1, wherein the plasma resistant dielectric layer comprises a ceramic compound comprising $Y_4Al_2O_9$ and a solid-solution of $Y_2O_3$—$ZrO_2$.

3. The electrostatic chuck of claim 1, wherein the metal layer shields the plurality of heating elements from radio frequency (RF) coupling and functions as an electrode for the electrostatic chuck.

4. The electrostatic chuck of claim 1, wherein the plurality of auxiliary heating elements are encased in a dielectric material that fills the plurality of recesses, and wherein the metal layer covers the dielectric material.

5. The electrostatic chuck of claim 1, wherein the metal layer covers an upper surface and side walls of the thermally conductive base, and wherein the thermally conductive base comprises a metal.

6. The electrostatic chuck of claim 1, wherein the metal layer functions as both a chucking electrode and a radio frequency (RF) electrode.

7. The electrostatic chuck of claim 1, wherein the metal layer has a thickness of approximately 20-50 mil and the plasma resistant dielectric layer has a thickness of approximately 10-20 mil.

8. The electrostatic chuck of claim 1, wherein the plurality of heating elements cause the electrostatic chuck to maintain a temperature variation of less than 0.5 degrees C. over a supported substrate during processing.

9. A method of manufacturing an electrostatic chuck comprising:
   providing a thermally conductive base;
   forming a plurality of recesses in an upper surface of the thermally conductive base;
   forming a plurality of auxiliary heating elements in the plurality of recesses;
   filling the plurality of recesses with a dielectric material;
   depositing a metal layer over the upper surface of the thermally conductive base; and
   covering the metal layer with a plasma resistant dielectric layer.

10. The method of claim 9, further comprising:
    depositing a layer of the dielectric material inside the plurality of recesses prior to forming the plurality of auxiliary heating elements in the plurality of recesses, wherein the dielectric material electrically isolates the plurality of auxiliary heating elements from the thermally conductive base.

11. The method of claim 10, wherein forming the plurality of auxiliary heating elements comprises depositing metal over the dielectric layer in the plurality of recesses, wherein the metal being a non-radio frequency (RF) heating metal.

12. The method of claim 9, wherein depositing the metal layer comprises depositing at least one of molybdenum, tungsten or aluminum using a plasma spray process, a physical vapor deposition (PVD) process or a sputtering process.

13. The method of claim 9, wherein the metal layer shields the plurality of auxiliary heating elements from radio frequency (RF) coupling and functions as an electrode for the electrostatic chuck, and wherein covering the metal layer with the plasma resistant dielectric layer comprises performing a plasma spray process, a sol-gel process, an aerosol spray process, or a physical vapor deposition (PVD) process.

14. The method of claim 9, wherein the plasma resistant dielectric layer comprises a yttrium dominant ceramic.

15. The method of claim 14, wherein the yttrium dominant ceramic comprises a ceramic compound comprising $Y_4Al_2O_9$ and a solid-solution of $Y_2O_3$—$ZrO_2$.

16. The method of claim 9, further comprising:
    forming a plurality of mesas on a surface of the plasma resistant dielectric layer.

17. An electrostatic chuck having been manufactured by a manufacturing process comprising:
    providing a thermally conductive base;
    forming a plurality of recesses in an upper surface of the thermally conductive base;
    forming a plurality of auxiliary heating elements in the plurality of recesses;
    filling the plurality of recesses with a dielectric material;
    depositing a metal layer over the upper surface of the thermally conductive base; and
    covering the metal layer with a plasma resistant dielectric layer.

18. The electrostatic chuck of claim 17, the manufacturing process further comprising:
    depositing a layer of the dielectric material inside the plurality of recesses prior to forming the plurality of auxiliary heating elements in the plurality of recesses, wherein the dielectric material electrically isolates the plurality of auxiliary heating elements from the thermally conductive base.

19. The electrostatic chuck of claim 17, wherein forming the plurality of auxiliary heating elements comprises depositing metal over the dielectric layer in the plurality of recesses, wherein the metal being a non-radio frequency (RF heating metal.

20. The electrostatic chuck of claim 17, wherein the metal layer shields the plurality of auxiliary heating elements from radio frequency (RF) coupling and functions as an electrode for the electrostatic chuck, and wherein covering the metal layer with the plasma resistant dielectric layer comprises performing a plasma spray process, a sol-gel process, an aerosol spray process, or a physical vapor deposition (PVD) process.

* * * * *